United States Patent [19]

Trausch et al.

[11] 4,357,205

[45] Nov. 2, 1982

[54] METHOD FOR ETCHED AND/OR GALVANIC PRODUCTION OF RING ZONES IN SMALL DIAMETER HOLES

[75] Inventors: Guenther Trausch; Wilfried Houben, both of Munich, Fed. Rep. of Germany

[73] Assignee: Siemens Aktiengesellschaft, Berlin & Munich, Fed. Rep. of Germany

[21] Appl. No.: 298,596

[22] Filed: Sep. 2, 1981

[30] Foreign Application Priority Data

Sep. 23, 1980 [DE] Fed. Rep. of Germany ....... 3035859
Aug. 18, 1981 [DE] Fed. Rep. of Germany ....... 3132658

[51] Int. Cl.$^3$ .......................... B44C 1/22; C23F 1/00; H01L 21/312
[52] U.S. Cl. ............................. 156/656; 156/659.1; 156/664; 430/312; 430/314; 430/316; 430/318; 204/15
[58] Field of Search ............... 430/312, 314, 316, 318, 430/319; 156/644, 651, 659.1, 661.1, 664, 656; 204/15, 32 R; 313/217; 427/433

[56] References Cited

U.S. PATENT DOCUMENTS

| | | | |
|---|---|---|---|
| 3,284,322 | 11/1966 | Pearlstein | 204/15 |
| 3,349,480 | 10/1967 | Rushleigh | 204/15 |
| 3,577,239 | 12/1968 | Lesnieski | 430/314 |
| 3,956,667 | 5/1976 | Veith | 315/169 TV |
| 4,047,077 | 9/1977 | Veith | 313/317 |

FOREIGN PATENT DOCUMENTS 55-5874 2/1980 Japan .................................. 430/318

Primary Examiner—Edward C. Kimlin
Assistant Examiner—F. K. Wine
Attorney, Agent, or Firm—Hill, Van Santen, Steadman, Chiara & Simpson

[57] ABSTRACT

A method employing etching technique alone or in combination with galvanic production of electrically conducting or insulating ring zones in small diameter holes which extend through a workpiece having a small thickness employs the steps of applying a base metallization to the surface of the workpiece including the walls of the holes, filling the holes with a positive photoresist which upon drying withdraws from the hole openings toward the inside of the hole forming a plug therein, irradiating both sides of the workpiece with ultraviolet light for making the photoresist partially soluble for a lacquer developer, and dissolving the partially soluble photoresist away up to a selected lacquer ring thickness. These steps are then followed by one of two steps. For the production of insulating ring zones one or several metal films are applied by galvanic deposition to those regions which have been freed of photoresist and the residual photoresist is dissolved away and the base metallization is selectively etched. For the production of conducting ring zones the base metallization is removed by etching technique from those regions of the holes which have been freed of photoresist.

10 Claims, 4 Drawing Figures

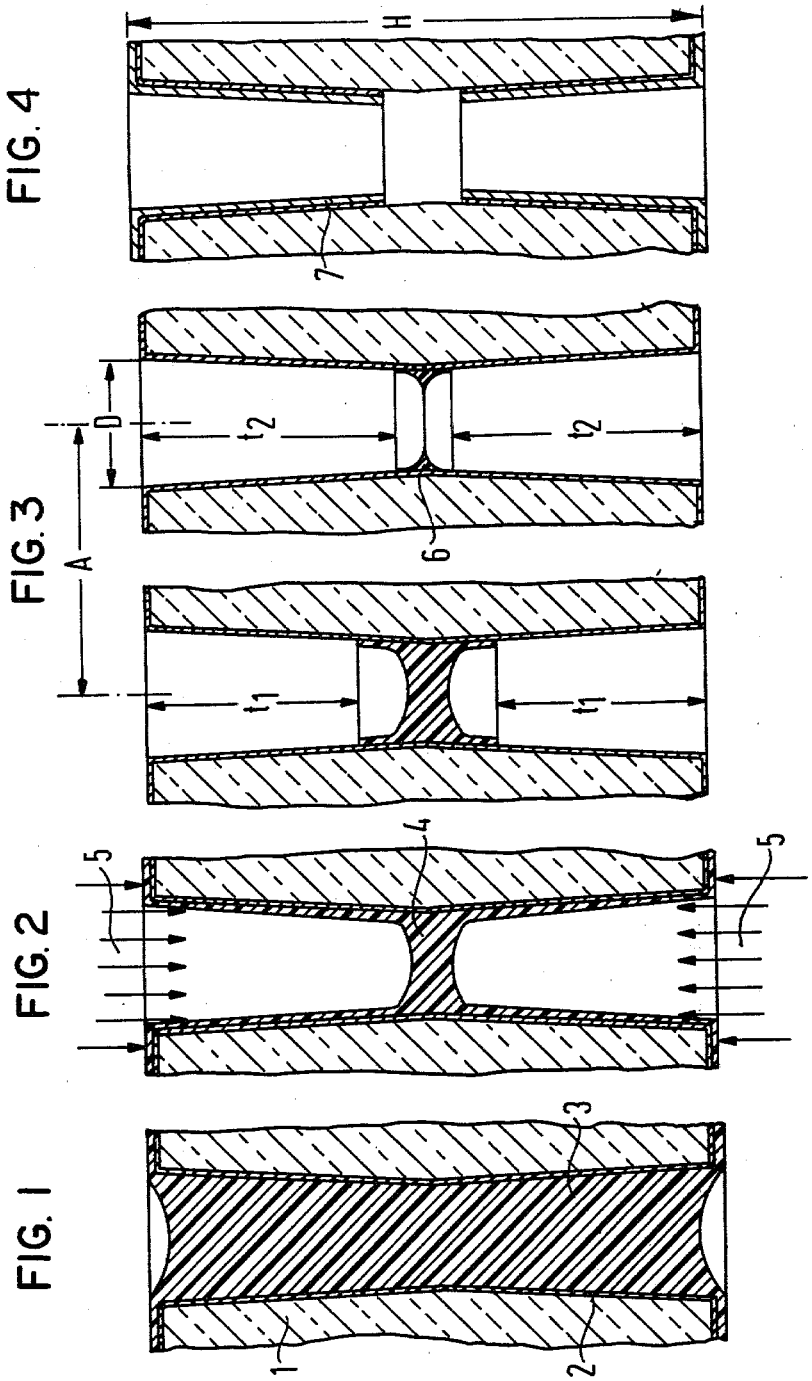

METHOD FOR ETCHED AND/OR GALVANIC PRODUCTION OF RING ZONES IN SMALL DIAMETER HOLES

BACKGROUND OF THE INVENTION

1. Field of the Invention

The present invention relates to methods for etching and galvanic production of electrically conducting or insulating ring zones in the interior of small diameter holes in a workpiece having a small thickness.

2. Description of the Prior Art

Gas discharge devices frequently employ a flat plasma screen of the type, for example, disclosed in U.S. Pat. No. 3,956,667 corresponding to German Pat. No. AS 24 12 869 wherein, for each picture point, the electron flow from the plasma chamber to the luminous material on the screen is regulated by means of an electrode matrix which is formed on a control disc or plate. The control plate is approximately the same size as the screen and consists of glass having a large number of holes or continuous perforations therein corresponding to the grid of picture points and which is coated on both sides with metal conductor paths. In order to avoid a high amount of charge at the inner walls of the holes, sometimes, the inner wall of the holes must be metallized and moreover the metallization must be interrupted within the hole for a short distance, determined by the depth of the hole, at a location approximately in the center of the hole so that the two sides of the control plate at no point are connected so as to be electrically conducting. Because of the fineness and large number of the perforations, production of such insulating ring zones is extremely difficult and represents a problem in the art.

SUMMARY OF THE INVENTION

It is an object of the present invention to provide a method for generating insulating ring zones in perforations having small diameter in a workpiece having a small thickness. It is a futher object of the invention to also provide a method for generating conducting ring zones in such a workpiece.

The above objects are inventively achieved in a method wherein a base metallization is applied to the workpiece surface including the interior perforation walls in a manner which is known in the art. This is followed by filling the holes with a positive photoresist which, upon drying, pulls away from the surface openings toward the inside of the individual perforations forming a plug in each perforation. The plug is then irradiated on both sides with ultraviolet light in order to make the photoresist partially soluble for a lacquer developer which is subsequently applied and which penetrates into the bore holes thereby dissolving the photoresist up to a desired lacquer ring thickness. For the production of insulating ring zones, these steps are followed by galvanic deposition of one or several metal layers on those regions of the holes which are freed of photoresist. The residual photoresist is detached and the base metallization is selectively etched away. For the production of conducting ring zones within the holes, the first series of steps is followed by an etching technique whereby the base metallization is removed in the regions which are freed of photoresist. In this manner, it is possible to generate a number of extremely thin ring zones in a large plurality of perforations disposed very close to each other, with the ring zones so generated all lying in substantially one plane parallel to the workpiece surface.

In a further embodiment of the method described above, the workpiece is immersed in the photoresist inclined at a specific angle to the lacquer surface, which angle is determined in dependence upon the thickness of the workpiece and the geometry of the perforations.

In another embodiment of the invention, the width of the conducting or insulating rings generated is determined by the amount of time during which the photoresist plug is exposed to ultraviolet radiation.

In yet another embodiment of the invention, before immersing the workpiece in the developer, air is partially evacuated from the perforations so that the developer can better penetrate into the perforations.

Another embodiment of the invention employs the step of controlling the ring width independently of the radiation time by determining the penetration depth of the lacquer developer in the perforations by the degree of air evacuation.

In another embodiment of the invention, the perforations are generated with a sloping interior wall such that the wall reaches a narrowest diameter in the interior of the perforation so that the lacquer plug forms at this point and thus the position of the lacquer rings is determined. If the lacquer rings are deliberately generated so as to not be centrally disposed in relation to the workpiece thickness, the exposure of the opposite sides of the plug is undertaken for different periods of time.

In another embodiment of the invention, before the deposition of one or more several metal layers or, during the production of conducting ring zones before the etching away of the base metallization, the workpiece surfaces are structured on one or both sides by photolithographic means with a negative dry resist whose developer does not damage the positive lacquer ring in the perforations. Thus, the ring zones can be generated even in workpieces having a structured surface.

A further embodiment of the invention eliminates the use of ultraviolet radiation to partially dissolve the photoresist adhering to the walls of the perforations. Instead of irradiation with ultraviolet radiation, the workpiece is subjected to a selected partial underpressure or vacuum so that a specific amount of air is removed from the perforations followed by complete immersion of the workpiece in a photoresist de-coating agent which dissolves the photoresist. The de-coating agent penetrates into the holes until it is stopped by the air volume remaining therein. The air volume depends directly upon the degree of evacuation before the immersion, so that the area of photoresist which is moved by the de-coating agent can be precisely controlled. Because the de-coating agent will continue to be absorbed by the photoresist to a slight degree at the bore walls, while avoiding the air volume, the amount of time during which the workpiece is immersed in the de-coating agent is a further determining factor in addition to the air evacuation for controlling the width of the ring which will remain. The de-lacquering or removal of the photoresist is stopped after removal of the workpiece from the de-coating agent by means of vigorous water rinsing, whereby the de-coating agent is diluted and displaced.

BRIEF DESCRIPTION OF THE DRAWINGS

FIG. 1 is a sectional view of a perforation during a first portion of the inventive method disclosed herein.

FIG. 2 is a sectional view of the perforation of FIG. 1 during a second portion of the inventive method disclosed herein.

FIG. 3 is a sectional view of adjacent perforations in different portions of the inventive method disclosed herein.

FIG. 4 is a sectional view of a perforation during a final portion of the inventive method disclosed herein.

DESCRIPTION OF THE PREFERRED EMBODIMENTS

A perforation or hole in a workpiece 1 is shown in various stages of the inventive process in FIGS. 1 through 4, and is shown in relation to an adjacent perforation in FIG. 3. It will be understood, as more fully explained below, that the adjacent holes shown in FIG. 3 would actually not exhibit different stages in the inventive process as is illustrated in FIG. 3, but would in reality proceed identically through the process for producing a ring zone therein. The different process stages are shown in FIG. 3 for exemplary purposes only.

The workpiece 1 has a thickness H and may be, for example, one millimeter thick glass but may be in the range of 0.1 to 3 millimeters thick having a plurality of piercing holes extending completely therethrough. The holes may, for example, have a diameter D of 0.2 millimeters and a grid interval A of, for example 0.4 millimeters. The holes are generated in the workpiece 1 by known means such as two-sided etching and may exhibit a cross section which is round, oval or angular. The entire workpiece surface including the walls of the holes is covered with a thin base metallization layer 2. The holes may exhibit a constant diameter throughout the entire thickness H or, as is shown in the FIGS., may have a diameter which decreases from each side and reaches a minimum at a point inside the hole, such as the midpoint of the thickness H.

For production of conducting or insulating rings within the holes, the holes are filled with a positive photoresist 3 as shown in FIG. 1 in such a manner that the resist 3 enters the hole from one side only and pushes out the air contained in the hole. As a result of capillary action, the holes having an order of magnitude as described above are filled at one opening thereof during contact with the photoresist 3 and thus hold the resist tightly. The resist is introduced to the holes preferably by means of slanted immersion of the workpiece into the resist and vertical withdrawal of the workpiece with a selected velocity.

During drying of the resist, the resist forms a thin solid layer on the workpiece surface. Inside the holes, the surface of the resist 3 withdraws from the surface openings toward the inside of the hole and, because of the surface tension of the resist, the resist solid collects around the narrowest point of the bore hole forming a plug 4 which completely fills the cross section of the hole, as is shown in FIG. 2. The thickness of the plug 4 is dependent upon the volume of the hole, the diameter of the hole, the inclination or slant of the wall of the hole, and the solid content of the resist.

By means of irradiation on both sides of the workpiece 1 with ultraviolet radiation 5, the relatively thin resist layer on the upper side of the workpiece 1, as well as the resist layer on the hole wall and a part of the plug 4, are chemically changed in such a manner as to be soluble in a lacquer or resist developer. In order for the developer, which is of substantially acquiesce content, to penetrate into the holes, which are now in the form of pockets, the air contained in the pocket or hole can be partially evacuated by immersing the workpiece 1 in the resist developer with a decreased surrounding atmospheric pressure.

When the air evacuation is incomplete, and after the underpressure surrounding the still-immersed workpiece 1 is equalized, the developer penetrates into the holes only so far as the remaining air in the hole permits. Because the ratio of the volume of the hole to the volume of enclosed air is the same for each hole and is determined solely by means of the vacuum selected, the depth to which the developer enters the hole can be predetermined, given holes having a constant inclination of the hole wall. This of course determines the extent to which the hole wall will be freed of resist. In FIG. 3, the penetration depth for the hole at the left of the FIG. is designated at t1. This method is not applicable when the enclosed volume of air is so small that the developer already contacts the edges of the plug 4. A narrower ring region protected by resist in the hole as well as a continuous hole can be achieved with the method disclosed and claimed herein by further proceeding as follows. Ultraviolet radiation on both sides is selected such that the plug 4 is soluble in the developer in the region of the hole axis at its full thickness, however is not soluble in the vicinity of the hole wall. This can be easily achieved because the plug is thinnest at its center and the radiation intensity is also highest at the center of the plug 4. By means of evacuation of the air in the atmosphere surrounding the workpiece 1 until approaching the developer vapor pressure, in combination with immersion of the workpiece and subsequent equalization of the underpressure, the plug 4 can be dissolved to form a ring 6 on the hole wall, as shown in the right hole in FIG. 3. The width of the ring 6 is controllable by controlling the duration of the ultraviolet irradiation. In this embodiment, the depth of the hole wall which is freed of resist is designated at t2.

The use of the ultraviolet radiation 5 can be eliminated altogether while still maintaining control of the width of the lacquer ring by evacuating a selected amount of the volume of air from the opposite sides of the perforation in the stage shown in FIG. 2 by means of subjecting the workpiece to a specific underpressure or vacuum. The workpiece is then totally immersed in a de-coating agent which dissolves the photoresist followed by equalizing the underpressure. The de-coating agent will penetrate into the hole until it is stopped by the air volume remaining therein. The air volume remaining in the pockets formed on each side of the plug 4 in the holes of the workpiece depends directly upon the degree of evacuation before the immersion of the workpiece in the de-coating agent. The de-coating agent will continue to seep into the photoresist to a slight degree at the bore wall, while avoiding the air volume, so that the length of time during which the workpiece remains in the de-coating agent is a further determining factor in addition to the amount of evacuation of air for controlling the remaining width of the photoresist plug. The process of de-lacquering or removal of the photoresist is stopped by means of a vigorous water rinsing, thus diluting and displacing the de-coating agent. For this special method other coatings and lacquers are as well suitable as a photo resist.

Viewed axially, if the resist plug 4 does not lie in the center of the hole, different irradiation times can be necessary from each side of the workpiece 1. If the hole cross-section is not circular, the resist ring which arises may be of a non-uniform thickness, such as displaying an increased thickness in the vicinity of the hole wall and also as a result of shading or screening of the ultraviolet radiation. This result can be eliminated to a large extent by means of constant or continuously changed inclination of the workpiece 1 with respect to the direction of radiation during the irradiation period.

Following the application of the photoresist layer, in the manner described above, one of two subsequent steps is undertaken depending upon whether an insulating or conducting ring is to be formed. For generation of an insulating ring zone, galvanic deposition of one or more metal films 7, as shown in FIG. 4, is undertaken on those regions which have been freed of photoresist. Finally, the photoresist ring is removed and the now free-standing base metallization 2 is selectively etched away so that the base material of the workpiece 1 is exposed.

For generation of a conducting ring zone, after dissolving the photoresist away with the developer, the base metallization 2 is removed by known etching technique in those regions which have been freed of photoresist.

If necessary, before the galvanic deposition of the one or several metal layers for producing an insulating ring, or, before the etching of the base metallization in the production of a conducting ring zone, the surface of the workpiece 1 can be structured on one or both sides by conventional photolithographic methods with a negative dry resist which employs a developer which does not damage the positive resist ring in the bore holes. Thus, suitable circuit runs can be generated on one or both surfaces of the workpiece in combination with the inventive process disclosed and claimed herein.

Although modifications and changes may be suggested by those skilled in the art it is the intention of the inventors to embody within the patent warranted hereon all changes and modifications as reasonably and properly come within the scope of their contribution to the art.

What is claimed is:

1. A method for production of electrically conducting or insulating ring zones on the wall of a small diameter continuous hole in a workpiece having a thickness in the range of 0.1 to 3 millimeters comprising the steps of:
    applying a base metallization to the surface of the workpiece including said walls of said holes;
    filling said holes with a positive photoresist and drying said photoresist such that said photoresist withdraws from the hole openings on the workpiece surfaces toward the inside of the hole forming a plug therein;
    subjecting both sides of said workpiece to a means for making said photoresist partially soluble for a resist developer;
    dissolving said partially soluble photoresist away from freeing portions of said wall of said hole of resist up to a selected resist ring thickness; and
    generating a ring zone in the interior of said hole by one of the following series of steps,
        galvanically depositing at least one metal layer on said portions of said wall of said hole which have been freed of said photoresist, dissolving said photoresist plug for exposing said base metallization, and selectively etching away said exposed base metallization for generating an insulating ring zone in said hole, and
        removing said base metallization by etching from said portions of said wall of said hole which have been freed of said photoresist for generating a conducting ring zone in said hole.

2. The method of claim 1 wherein the step of filling said holes with said positive photoresist is further defined by immersing said workpiece in said photoresist inclined at a selected angle with respect to a surface of said photoresist, said angle selected in dependence upon the thickness and geometry of said hole.

3. The method of claim 1 wherein the step of subjecting both sides of said workpiece to a means for making said photoresist partially soluble for a resist developer is further defined by irradiating both sides of said workpiece with ultraviolet light.

4. The method of claim 3 wherein the thickness of said ring zone is determined by selected irradiation time in said step of irradiating said plug with ultraviolet radiation.

5. The method of claim 1 comprising the further step of partially evacuating the air from the interior of said holes before dissolving said photoresist with said developer.

6. The method of claim 5 wherein the thickness of said ring zone is determined independently of the time of subjecting said workpiece to a means for making said photoresist partially soluble by selectively partially evacuating said air from said holes for permitting a selected penetration depth of said developer in said hole.

7. The method of claim 1 comprising the additional step of generating said holes with a varying interior diameter having a narrowest point such that said plug forms at said narrowest point.

8. The method of claim 3 wherein said insulating ring is not disposed in a center of said hole and wherein said step of irradiating both sides of said workpiece is further defined by irradiating both sides of said workpiece for different periods in accordance with the distance of said plug from each side of said workpiece.

9. The method of claim 1 comprising the additional step of generating a conductor structure on at least one side of said workpiece by photolithographic means with a dry resist employing a developer which does not damage said positive photoresist ring in said hole, said additional step being undertaken immediately prior to said one of said two steps for generating said ring zone in said hole.

10. The method of claim 1 wherein said step of subjecting said workpiece to a means for making said photoresist partially soluble for a resist developer is further defined by the steps of:
    partially evacuating the air in said holes such that a selected volume of air remains in said holes on opposite sides of said plug;
    immersing said workpiece in a photoresist decoating agent followed by equalizing the underpressure, whereby said de-coating agent penetrates both sides of said hole to a depth which is determined by the volume of air which remains in said hole; and
    stopping the de-coating of said photoresist by vigorously rinsing said workpiece with water.

* * * * *